(12) United States Patent
Garland et al.

(10) Patent No.: US 6,441,697 B1
(45) Date of Patent: Aug. 27, 2002

(54) ULTRA-LOW-LOSS FEEDTHROUGH FOR MICROWAVE CIRCUIT PACKAGE

(75) Inventors: Paul Garland, San Diego; James Kyo Long, El Cajon; Yozo Satoda, San Diego; Chong-Il Park, Poway, all of CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 09/238,273

(22) Filed: Jan. 27, 1999

(51) Int. Cl.$^7$ ................................................. H01P 1/04
(52) U.S. Cl. .......................... 333/34; 333/260; 257/728
(58) Field of Search ................................. 333/246, 247, 333/260, 34; 257/728

(56) References Cited

U.S. PATENT DOCUMENTS

| | | | |
|---|---|---|---|
| 3,715,635 A | * 2/1973 | Michel et al. ............. | 333/34 X |
| 3,767,979 A | 10/1973 | Reber et al. | |
| 4,713,634 A | * 12/1987 | Yamamura ............... | 333/247 X |
| 4,870,375 A | * 9/1989 | Krueger, Jr. et al. ......... | 333/246 |
| 4,901,041 A | 2/1990 | Pengelly ....................... | 333/33 |
| 4,906,953 A | * 3/1990 | Li et al. .................. | 333/246 X |
| 5,023,993 A | 6/1991 | Fengelly ..................... | 29/843 |
| 5,175,611 A | 12/1992 | Richardson et al. ........ | 257/699 |
| 5,194,833 A | 3/1993 | Dougherty et al. ........... | 333/33 |
| 5,352,998 A | 10/1994 | Tanino ........................ | 333/247 |
| 5,401,912 A | 3/1995 | Mattei ......................... | 174/263 |
| 5,428,327 A | * 6/1995 | Bahl ....................... | 333/247 X |
| 5,522,132 A | 6/1996 | Mattei ......................... | 29/846 |
| 5,602,421 A | 2/1997 | Li .............................. | 257/728 |

FOREIGN PATENT DOCUMENTS

JP 314403 * 12/1989 ................. 333/246

* cited by examiner

Primary Examiner—Benny Lee
(74) Attorney, Agent, or Firm—Hogan & Hartson, L.L.P.

(57) ABSTRACT

RF feedthroughs for use with monolithic microwave integrated circuits (MMIC) are installed in environmentally protective or hermetically sealed packages that provide electromagnetic shielding. A feedthrough for an MMIC package has a dielectric substrate, a microstrip or transmission line formed on the substrate for transmitting high frequency electronic signals and a wall disposed above the transmission line and the substrate. The wall of the feedthrough has a varying thickness so that the narrowest portion of the wall is disposed on the transmission line substantially perpendicular to the substrate. The transmission line also has a varying width so that the narrowest width portion of the transmission line crosses the narrowest portion of the wall. The narrowest portion of the wall may be created by placing two oppositely facing concaved surfaces on each side of the wall. To reduce parasitic capacitance, the substrate and the wall may each have an air cavity embedded in respective bodies.

11 Claims, 5 Drawing Sheets

ULTRA-LOW-LOSS FEEDTHROUGH FOR MICROWAVE CIRCUIT PACKAGE

BACKGROUND OF THE INVENTION

1. Field of the Invention

This invention relates generally to packaging of microwave circuits and more particularly concerns packaging that provides an ultra-low insertion loss feedthrough with particular interests in the high microwave frequencies and in applications using hermetically sealed packages for monolithic microwave integrated circuits.

2. Description of Related Art

Ultra high speed monolithic microwave integrated circuits (MMIC), microwave integrated circuits (MIC), other integrated circuits and hybrid circuit dies are mounted in environmentally protective or hermetically sealed packages that provide electromagnetic shielding and easy handling. Known manufacturing techniques include cofired ceramic enclosures using thick or thin film metallization, glass or quartz seals, ceramic enclosures using thin-film metallization, metal enclosures having ceramic feedthroughs, and metal enclosures having glass feedthroughs.

In cofired ceramic packages generally available for MMIC's, the main contributor to poor microwave performance is the feedthrough. In conventional designs, discontinuity for poor performance exists due to the lead attachment, to passage of the conductor into and out from the ceramic wall, to changes in the conductor width and to coupling of RF signals to the lid and lid sealing ring. These discontinuities introduce higher-order modes and reflection as a result of impedance mismatch and contribute to overall poor feedthrough performance by having higher insertion loss. An MMIC package capable of good performance in the microwave range should have low insertion loss per feedthrough.

The insertion loss of a coaxial line or stripline formed on the feedthrough through a hermetically sealed ceramic wall increases with higher frequency, which results in a diminished signal strength. High insertion loss degrades MIC performance in many ways such as increased noise figure of small signal devices and reduced output power and efficiency of a power amplifier.

Figure 1:
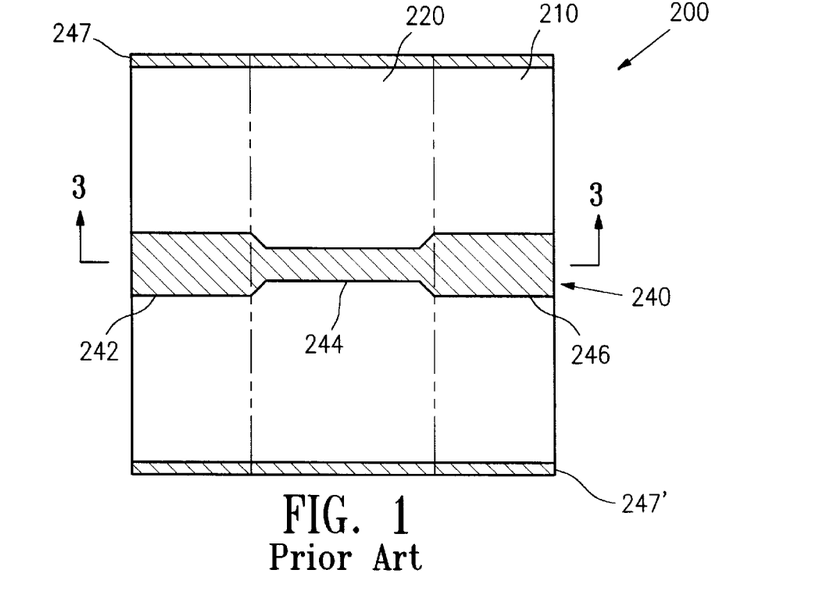
FIG. 1 is a top plan view of a prior art feedthrough for a microwave package.
Figure 2:
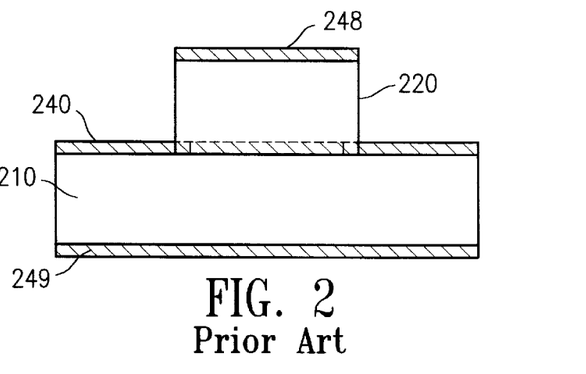
FIG. 2 is a side elevational view of FIG. 1.
Figure 3:
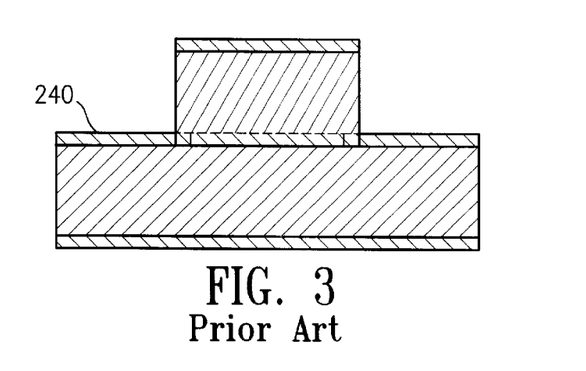
FIG. 3 is a cross-sectional view of FIG. 1 along the line 3–3 thereof.

FIGS. 1–3 show a conventional feedthrough. The conventional feedthrough 200 has a substrate 210 (see FIG. 1) which is typically 15 mils thick and a block wall 220 mounted on the top surface of the substrate, as seen in FIGS. 1 and 2. The feedthrough 200 has a conductive microstrip line 240 traced on the top surface for transmitting RF signals. As seen in FIG. 1, the microstrip line 240 has three sections: an outer section 242, a middle 244 and an inner section 246. In general, the middle section 244 has a narrower width than that of the other sections.

As shown in FIG. 1, the block wall 220 covers substantially all of the middle section 244 of the microstrip line 240. The middle section 244 is formed on the substrate 210 using a tungsten layer which forms an hermetically sealed joint to the block wall 220. The outer and inner sections 242 and 246 are gold plated to at least 100 micro inches thick, but the middle section 244 is not and cannot be plated with gold, since it is already sealed with the block wall 220. As a result, the middle section 244 increases insertion loss. Moreover, the trace width of the middle section 244 is reduced to compensate for the additional parasitic capacitance due to the block wall 220, further adding to the series resistance for the middle section 244.

The bottom 249, (see FIG. 2), sides 247 and 247' (see FIG. 1) and top 248 (see FIG. 2) surfaces of the feedthrough are also metallized and plated with nickel so that the feedthrough 200 can be brazed in place between the side wall and the base flange of the package making a hermetically sealed package.

At higher microwave frequencies, including millimeter wave, the thickness of the substrate 210 must be reduced to eliminate higher order transmission modes. The reduction of substrate thickness necessitates reduction in strip width of microstrip line 240, including all three sections 242, 244, and 246. This further increases the insertion loss due to the block wall 220 section by compensating for the parasitic capacitance arising from the block wall 220.

SUMMARY OF THE INVENTION

It is an object of the present invention to provide a high-frequency low-loss hermetic feedthrough which has an impedance compensated thin hermetic wall to provide high frequency packages and modules with low insertion loss.

It is another object of the present invention to provide an RF feedthrough suppressing surface modes.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

According to one embodiment of the present invention, a feedthrough for an MMIC package has a substrate, a microstrip transmission line formed on the substrate for transmitting high frequency electronic signals and a wall disposed above the transmission line and the substrate. The wall of the feedthrough has varying thickness so that the narrowest width portion of the transmission line substantially crosses the narrowest portion of the wall. The narrowest portion of the wall may be created by placing two oppositely facing concave surfaces on each side of the wall. To reduce parasitic capacitance, the substrate and the wall may each have an air cavity imbedded in respective bodies near the vicinity of the transmission line.

According to one feature of the invention, the substrate of the feedthrough is made of dielectric ceramic material cofired to form an hermetic feedthrough.

According to other features of the invention, the transmission line has a first section, a second section and a middle section formed between the first and second sections. The middle section has a narrower width than that of the first and second sections. The first section of the transmission line extends to the narrower middle section by forming a transition edge of about a 90 degree angle. To minimize the area of the transmission line being crossed over by the wall, the narrow portion of the wall is preferably disposed above the middle section of the transmission line which also has the narrowest width. According to the present invention, the length of the middle section of the transmission line may be made longer or shorter than the width of the narrow portion of the wall, or none at all depending on the wall thickness of the narrowest width. This notch in the transmission line depends on the degree of compensation desired for increased parasitic capacitance due to the hermetic wall.

According to another embodiment of the present invention, a feedthrough for a MMIC package includes a substrate, a transmission line formed on the substrate for conducting an electronic signal and a wall having an inverse pyramid shape. In other words, the wall has a layered construction with a narrower lower portion and a wider upper portion. The narrower portion is preferably disposed substantially above and crosses the transmission line. The wall is made of a dielectric material and is disposed on the transmission line.

According to one feature of the invention, the substrate has an air cavity formed substantially above the transmission line. The wall comprises a plurality of layers constructed to have gradually increasing width from the narrower lower portion to the wider upper portion. These and other aspects, features and advantages of the present invention will be better understood by studying the detailed description in conjunction with the drawings and the accompanying claims.

BRIEF DESCRIPTION OF THE DRAWINGS

A detailed description of embodiments of the invention will be made with reference to the accompanying drawings, wherein like numerals designate corresponding parts in the several figures.

DETAILED DESCRIPTION OF THE PREFERRED EMBODIMENTS

Low noise or high power integrated circuit packaging according to a preferred embodiment of the present invention is shown in the drawings for the purposes of illustration. The present invention is suited for applications in which low insertion loss and hermeticity are required to protect semiconductors and other internal elements. Generally, insertion loss is the combination of energy lost due to signal dissipation and signal reflection resulting from the transmission of an RF signal. The loss is measured between two detection points, such as from an input lead to an output lead. One of the main properties affecting the insertion loss is the electrical conductivity of the metals used for transmitting the RF signal. The other component causing an increase in insertion loss is due to the impedance mismatch loss.

Figure 4:
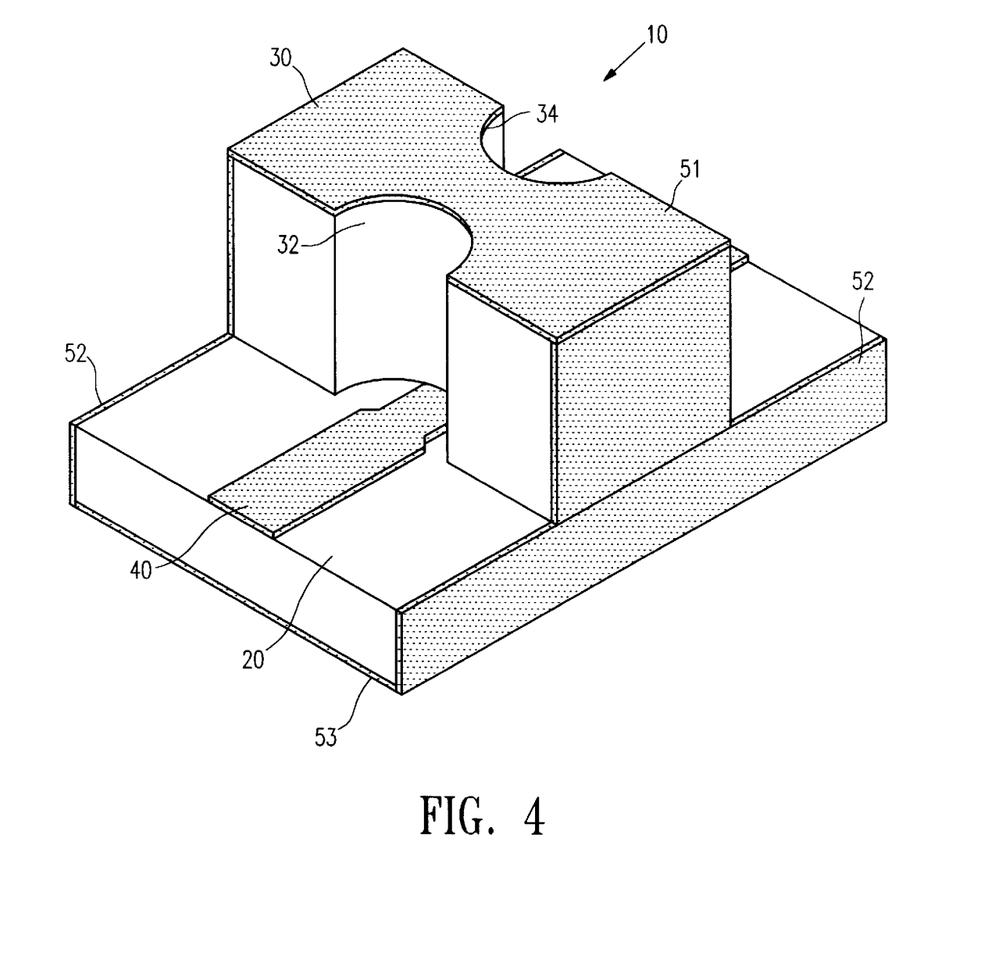
FIG. 4 is a perspective view of an RF feedthrough according to a preferred embodiment of the present invention.

FIG. 4 illustrates a perspective view of the low loss feedthrough 10 constructed in accordance with the preferred embodiment of the present invention for use in hermetic microwave packages. The feedthrough 10 has a substrate 20, a wall 30 mounted on the substrate 20 and a microstrip line 40 (also referred to as a microstrip transmission line disposed between the wall 30 and the substrate 20). A main feature of the low loss feedthrough 10 is a unique structure of the wall 30 and the shape of the transmission line formed around the hermetically sealed wall 30, for housing the MMICs in an hermetic package.

The feedthrough 10 according to the present invention provides the microstrip line 40, also known as a transmission line, which conducts a signal, preferably in microwave through millimeter-wave frequency, between the exterior of an electronics package, such as an MMIC package, and integrated circuit chips located inside such package. The integrated circuit chips or MIC circuits operate at frequencies generally greater than 1 GHz.

A dielectric substrate 20 shown in FIG.4 is formed of a suitable dielectric material, such as an aluminum oxide or silicon dioxide. the wall 30, which hermetically seals the integrated circuits contained inside a package, is hermetically sealed on top of tungsten patterned with a microstrip line on substrate 20 as well as the cofired ceramic wall 30 and the substrate 20. For higher frequency packages, the dielectric substrate 20 has thinner thickness to minimize undesirable effects caused by surface modes. A conventional base substrate is approximately 15 mils thick. To maintain a constant characteristic impedance in connection with a microstrip line 40 deposited on the substrate 20, the allowable width of the microstrip line 40 is related to the thickness of the substracte 20 to form a 50 ohm impedance. The dielectric substrate 20 has a width of about 40 mils, length of 60 mils, and thickness of about 8 mils. The transmission line would have a width of about 8 mils for the sections 42 and 46 and perhaps 5 mils in section 44. At higher frequencies, these dimensions are expected to be further reduced.

Figure 5:
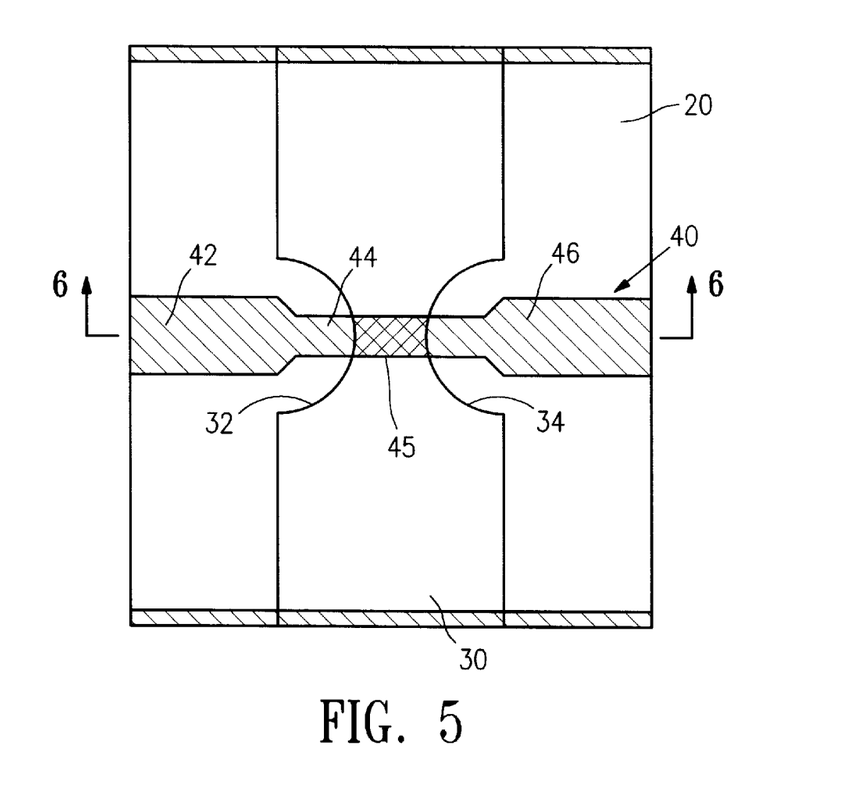
FIG. 5 is a top plan view of FIG. 4.

The microstrip line 40 shown in FIGS.4 and 5 is a metallization formed on the dielectric substrate 20. As seen in FIG. 5, by using a printing method in particular, the microstrip line 40 is divided into three different segments: an outer section 42, a middle section 44 and inner section 46. The outer, middle and inner sections 42, 44, and 46 contiguously form a single piece microstrip line 40. The outer section 42 and the inner section 46 are separated by the wall 30. The wall is projected from the substrate 20, preferably crossing the middle section 44 of the microstrip line 40. The microstrip line 40 is made with a suitable metallization process using conductive materials, such as tungsten. Alternatively, any suitable material deemed proper by one of ordinary skill in the art may be used for the microstrip line 40. The process of forming the microstrip line 40 will be described later.

The buried section 45 (cross-hatched) of the middle section 44 which is a printed tungsten film directly under the wall 30, forms an hermetically sealed RF feedthrough wall for the package. The microstrip line 40, except the buried section 45, is gold plated to reduce its sheet resistance, and enable bonding during assembly. However, the buried section 45 cannot be plated, and thus it remains as tungsten film behaving as a series resistance between the outer and inner sections 42 and 46. By minimizing the wall thickness, two beneficial results occur: First, the resistance value between the hermetically sealed buried section 45 under the ceramic wall 30 is minimized. Second, the amount of parasitic capacitance due to the wall 30 is reduced resulting in less impedance compensation required to maintain low mismatch loss.

Impedance compensation requires a combination of reduction of transmission line width and length of line reduced as seen by the middle section 44 of the microstrip line 40. When it is properly compensated, low mismatch loss is achieved over a broad frequency range. In general, the greater the reduction of transmission line width and the shorter the middle section 44, the higher the frequency that can be achieved. This compensated section should be physically close to the vertical wall 30. Preferably, the length of the buried section 45 should be minimized. For a given design requirement, the designer may select a shorter buried section 45, and may choose to design a different middle section 44 to reduce mismatch loss. All of these variations are covered by this invention including the fact that for a very thin section of the wall 30, no impedance compensation for the buried section 44 may be required.

In the preferred embodiment, as seen in FIG. 4, the top 51, side 52 and bottom 53 surfaces of the feedthrough 10 are metallized and plated with nickel so that the feedthrough 10 can be brazed in place between the side wall and the base flange of the package making a hermetically sealed package.

In the preferred embodiment, the length of the buried section 45 covered under the wall 30 is reduced to less than about 8 mils. Preferably the middle section 45 covered under the wall 30 should be as short as practically possible, but still maintaining structural integrity and hermeticity. The ultimate for this structure is the inverse pyramid structure for the wall which is described as a second embodiment of the invention. Such minimization of the buried section covered by the wall 30 reduces insertion loss due to its associated series resistance with the tungsten film and reduced mismatch loss compensation requirements.

The feedthrough 10 according to the present invention has the wall 30 to form a hermetic structure which protects the critical elements inside the microwave package. Unlike the conventional wall, the feedthrough 10 has a unique shape and design to reduce the insertion loss, while maintaining the hermeticity of the MMIC package. The wall 30 is configured so that only a small width of the ceramic is over the microstrip line 40. For simple structures, there are two opposite facing recesses or concaved surfaces 32 and 34 on each side and middle portion of the wall 30, as seen in FIGS. 4 and 5. When the feedthrough 10 is installed in an MMIC package, the outer concave surface 32 forms an outer surface of the package, whereas the inner concave surface 34 forms an inner surface. Preferably, both have a radius of about 6.7 mils. As an alternative embodiment, the wall 30 may be equipped with only one recess or concaved, grooved or indented surface.

As best seen in FIG. 5, the wall 30 is positioned substantially in the middle of the substrate 20 to evenly divide the microstrip line 40 into two exposed segments. In particular, the wall 30 is placed on the middle section 44 of the microstrip line 40. The wall is made of a dielectric material. In that regard, the wall 30 and substrate 20 may be made with the same dielectric material, so it makes a hermetically sealed joint between the wall 30 and the substrate 20.

The wall 30 has a width of about 18 to 20 mils, a lenght of about 40 mils and a thickness of about 20 mils. As a result of having two opposite facing concaved surfaces 32 and 34 in the wall 30, the narrowest width region of the wall, having the width of about 5 to 8 mils, covers the middle section 44 of the microstrip line 40 effectively reducing the effect of parasitic capacitance and the length of unplated tungsten film under the wall 30, thus reducing the parasitic series resistance. Alternatively, in lieu of the concaved surfaces 32 and 34, the wall 30 may be equipped with other types of recesses, such as grooves or indentations.

FIG. 5 illustrates a top plan view of the low loss feedthrough 10. As shown, the concaved surfaces 32 and 34 of the wall 30 cross the middle section 44 of the microstrip line 40 to minimize the microstrip line region covered by the wall 30. In addition, the middle section 44 of the microstrip line 40 has a narrower width and length than the outer and inner sections 42 and 46 to optimize impedance matching by minimizing the mismatch loss. As frequency increases, the length and width need to be shorter.

The area directly under the concaved surface of wall 30, the buried section 45, is the bare tungsten film area which has higher series resistance than the other part of the middle section 44. The buried section 45 is the source of parasitic resistance and capacitance that are being reduced by this invention. When the parasitic capacitance is reduced, then the required impedance compensation to minimize the mismatch loss is also reduced. Thus, the ultimate limit for the narrowest width region of the wall depends on the structural strength required for the wall and the hermeticity requirements.

Figure 6:
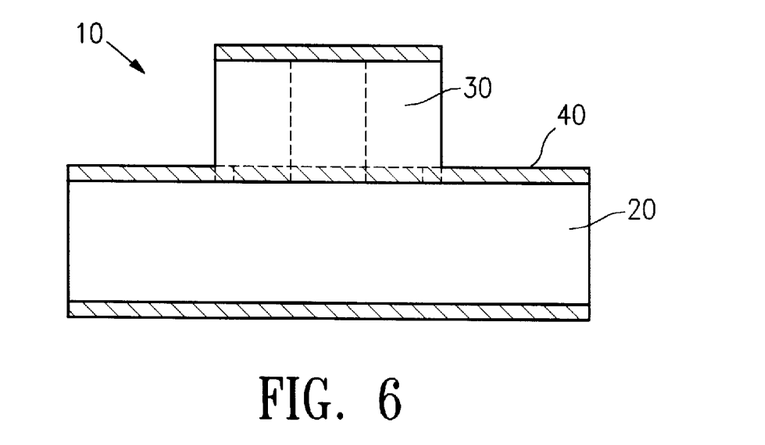
FIG. 6 is a cross-sectional view of FIG. 4 along the line 6–6 of FIG. 5.

FIG. 6 illustrates a side elevational view of the low loss feedthrough 10. Depending on specific design requirements, the dimensions of each component of the feedthrough 10 may be varied. The wall structure 30, described above and shown in FIG. 6, reduces stress of manufacturing and requires the use of special ceramic forming techniques to make the small geometry required for the electrical performance. The assembly operations on materials are all optimized to reduce stresses through the assembly to maintain the integrity of the small geometry. As shown in FIG. 6, the wall structure 30 is disposed over the microstrip line 40 formed on and extending across the top surface of the substrate 20.

The manufacturing process of the feedthrough 10 according to the present invention shall now be described. First, to make a wall 30 of the feedthrough 10, an alumina ceramic tape having a thickness of about 20 mils is taped to a metal frame. The alumina ceramic tape is punched with a hard punch tool having a shape of the concaved surface formed in the middle portion of the wall 30 to individually punch out the concave portion. A thick film of tungsten paste is then screen printed on the alumina ceramic tape, including the top and bottom surfaces, the top of the wall 30 and the bottom of substrate 20. The resulting metallized trace forms a microstrip/stripline transmission line. The wall 30 created by the above process is then laminated on the substrate 20 and cofired in a furnace at a temperature between 1,500 to 1,600 degrees C, thereby bonding the two ceramic layers to one another and sintering the alumina ceramic tape applied between the tungsten paste and the substrate 20. In this process, the tungsten traces are bonded to and between the dielectric substrate 20 and ceramic wall 30.

Once fired, the two vertical surfaces parallel to the transmission line need to be metallized, if not already metallized during the cofired process. This metallization with brazing or soldering will make the hermetic seal possible. This can be done in a variety of methods. One such method is to separate each feedthrough and fixture it on its side for another printing and firing step. This firing should occur with a conductor with a lower firing temperature than the cofiring step. This step may be either repeated for the opposite side, or if fixtured properly, both sides may be printed at the same time and fired once. Once metallized, the feedthrough is plated with a metal, either as a base coat for soldering, or for brazing into a package housing. This plating is typically performed using nickel.

The present invention can be equally implemented, employing either high or low temperature fired materials and processes known to one of ordinary skill in the art.

Figures 7, 8:
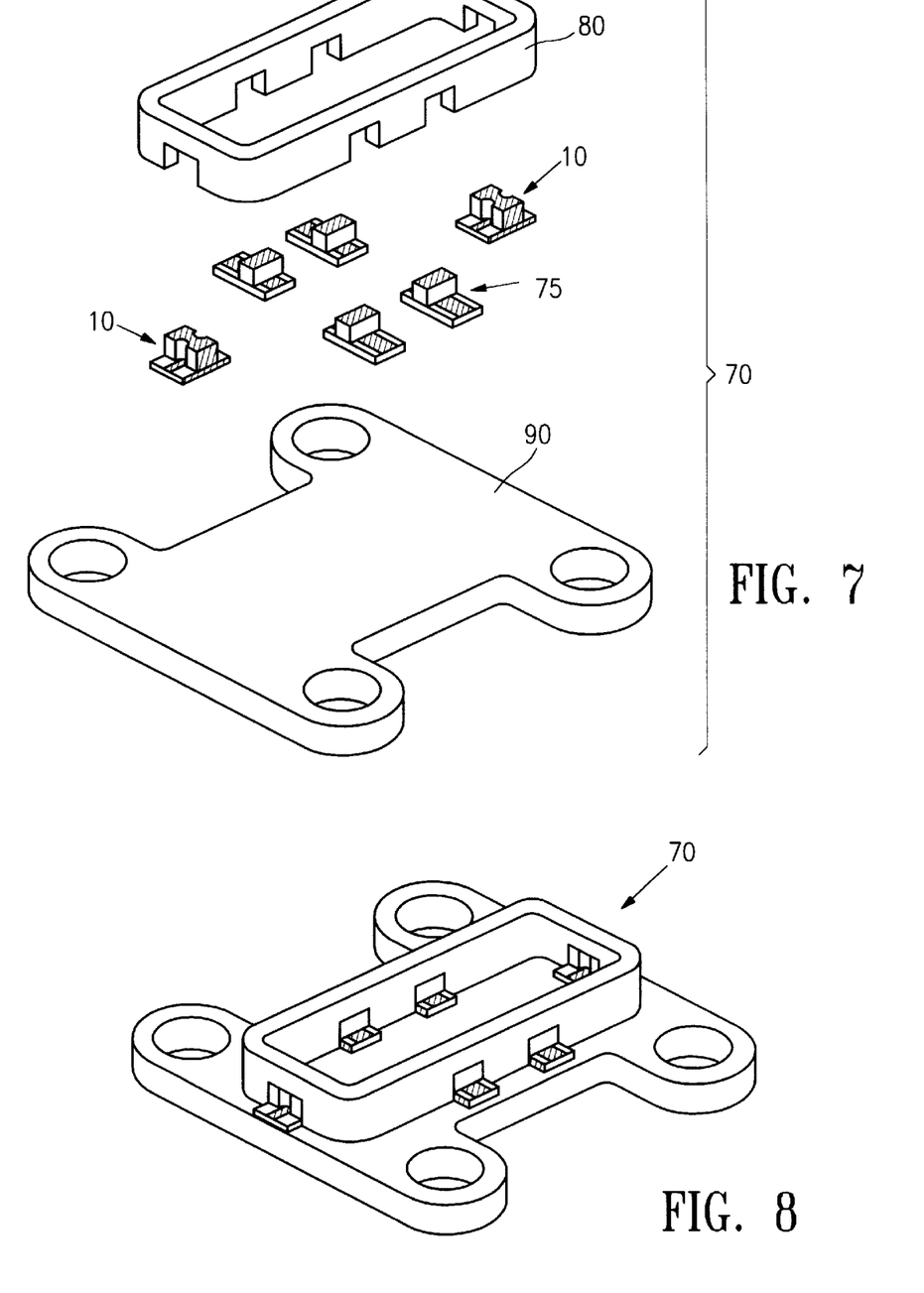
FIG. 7 is an exploded view of an MMIC packaging using RF feedthroughs of the present invention.
FIG. 8 is an assembled representation of the MMIC packaging of FIG. 7.

FIG. 7 illustrates an exploded view of an MMIC package 70 using the feedthrough 10 of the present invention. FIG. 8 illustrates a representative MMIC package 70 incorporating two RF feedthroughs and four DC feedthroughs, with like reference numerals designating like elements. As seen in FIG. 7, the MMIC package 70 includes a flange 90 and a side wall 80 preferably made of an alloy of iron, cobalt and nickel or an alloy whose composition gives a thermal expansion that closely matches the ceramic material. The side wall 80 has receptacles for receiving the RF feedthroughs 10 of the present invention and further receiving DC feedthroughs 75.

Figure 9:
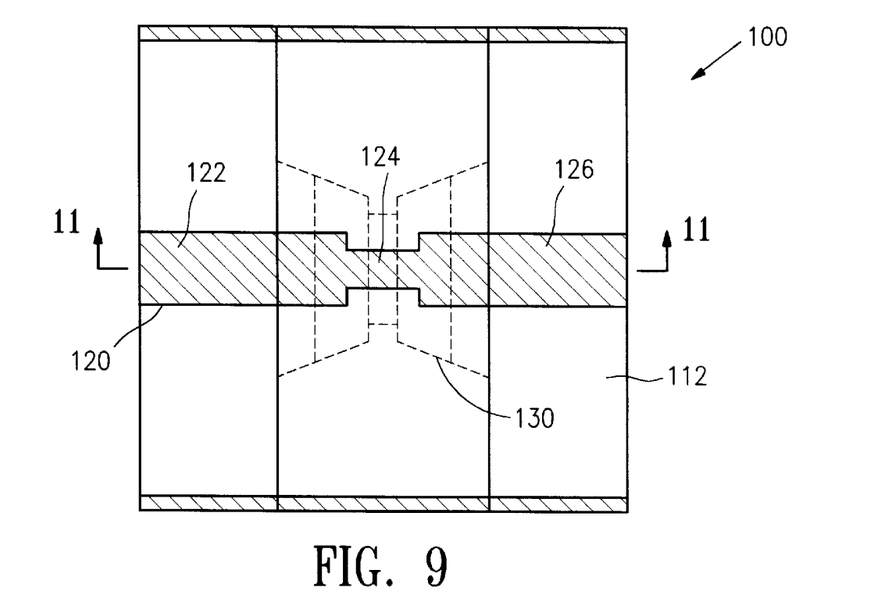
FIG. 9 is a top plan view of an RF feedthrough according to a second embodiment.

FIG. 9 illustrates a top plan view of the low-loss feedthrough 100 constructed in accordance with a second embodiment of the present invention for use in hermetic MMIC packages. The main feature of the low-loss feedthrough is a step-up multilayer wall structure for housing the MMIC package and embedded air cavity above the microstrip line.

In the feedthrough 100, the microstrip line 120 conducts a signal between the exterior of an electronic package and semiconductor devices located inside such a package. A dielectric substrate 112 shown in FIG. 9 is formed of a suitable dielectric material, such as an aluminum oxide or silicon dioxide. A multilayered ceramic wall 130 is positioned on the substrate surface. The two ceramic layers (i.e., the dielectric substrate 112 and the ceramic wall 130) are then pressed together and fired at a temperature between 1,500 to 1,600 degrees C, thereby bonding the two ceramic layers to one another and vaporizing the organic binder material that binds the aluminum oxide and the tungsten paste which becomes the microstrip line. In this process, the tungsten traces are bonded to and between the dielectric substrate 112 and the ceramic wall 130. The present invention can be equally implemented employing either high or low temperature fired materials and processes.

Figure 10:
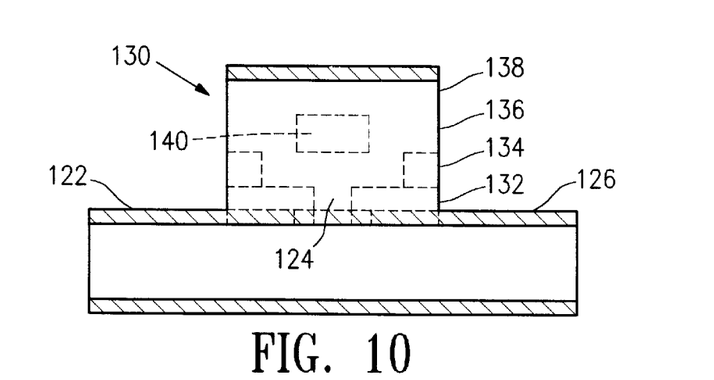
FIG. 10 is a side elevational view of FIG. 9.
Figure 11:
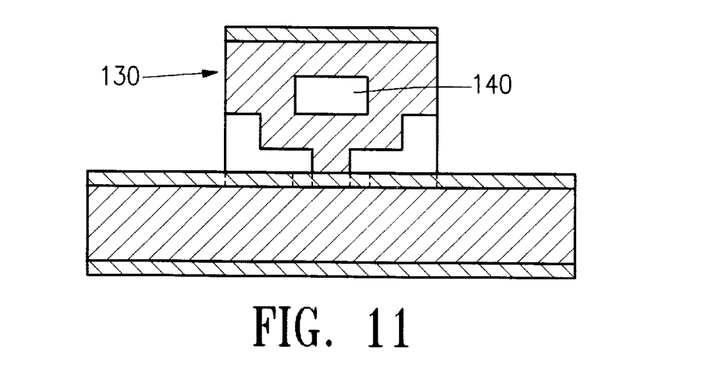
FIG. 11 is a cross-sectional view of FIG. 9 along the line 11–11 thereof.

The construction of the multilayered ceramic wall 130 is now described with respect to FIGS. 10 and 11. The wall 130 is multilayered and stacked in an inverse pyramid shape to minimize the covering of the microstrip line 120 and the wall 130. In particular, the ceramic wall 130 includes a first ceramic layer 132, a second ceramic layer 134 disposed on top of the first ceramic layer 132, a third ceramic layer 136 disposed on top of the second ceramic layer 134 and a fourth ceramic layer 138 disposed on top of the third ceramic layer 136 to form a step-like cross-sectional shape as shown in FIGS. 10 and 11. The upper layers of the wall 130 are wider than a lower layer to allow sufficient area for seam-sealing a package lid.

The first ceramic layer 132 preferably has a length of about 5 mils and a width of about 15 mils. The second ceramic layer 134 preferably has a length of about 15 mils and a width of about 25 mils. The third ceramic layer 136 preferably has a length of about 25 mils and a width of about 25 mils and a width of about 30 mils.

Between the third ceramic layer 136 and the fourth ceramic layer 138, there is preferably an air cavity 140 formed substantially above the middle section 124 (see FIGS. 9, 10) of the microstrip line 120. The air cavity 140 is approximately 15 mils by 25 mils and maintains hermeticity through the ceramic wall layers 132, 134, 136, 138, at the same time reducing the parasitic capacitance of the feedthrough 120. In addition, the air cavity 140 reduces the resistance of the first transmission line section 122 (see FIGS. 9, 10) which operates as an input line.

The embedded air cavity 140 is designed to isolate the effect of the top layer ground on the transmission line. This allows the predominant electric field pattern to remain concentrated in the lower substrate, matching the field pattern of the microstrip bonding pad area connected to the second transmission line section 126 (see FIGS. 9, 10).

One benefit of having a multilayered wall 130 having the narrowest wall as the first ceramic wall 132 is its reduced susceptibility to misalignment of the ceramic wall. In general the ceramic wall alignment has a tolerance of ±5 mils. By extending the narrow portion of the microstrip line 120 well inside the ceramic wall region, the misalignment does not expose the narrow trace width outside the ceramic wall.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims rather than the foregoing description, and all changes which come within the meaning and range of equivalency of the claims are therefore in tended to be embraced therein.

What is claimed is:

1. A feedthrough for use in a monolithic microwave integrated circuit package, the feedthrough comprising:

a substrate having a flat upper surface;

a transmission line disposed on the flat upper surface of and extending continuously along the substrate for conducting an electrical signal; and a dielectric wall having an inverse pyramid shape with plural sloped sides defining a narrow lower portion and a wide upper portion, wherein the narrow lower portion is disposed substantially above and crosses the transmission line.

2. The feedthrough of claim 1, wherein the transmission line has a first section, a second section and a middle section disposed between the first and second sections, along the continuously extending transmission lines, the middle section having a narrower width than respective widths of the first and section sections to provide impedance compensation to the transmission line.

3. The feedthrough of claim 2, wherein the first section of the transmission line extends to the middle section via a transition edge of about 90 degree angle.

4. The feedthrough of claim 2, wherein the dielectric wall comprises a plurality of layers of gradually increasing width from the narrow lower portion to the wide upper portion.

5. The feedthrough of claim 2, wherein the narrow lower portion of the dielectric wall is disposed above the middle section of the transmission line.

6. The feedthrough of claim 5, wherein the dielectric wall has an air cavity disposed substantially above the transmission line.

7. The feedthrough of claim 1, wherein the dielectric wall has an air cavity disposed substantially above the transmission line.

8. A feedthrough for use in a monolithic microwave integrated circuit package, the monolithic microwave integrated circuit package having an opening to receive the feedthrough, the feedthrough adapted to the opening and the microwave integrated circuit package to seal with the opening, the feedthrough comprising:

a substrate having at least a flat dielectric surface, the substrate having a width adapted to span the opening in the microwave integrated circuit;

a transmission line extending continuously along a length of the substrate on the flat dielectric surface of the substrate for conducting an electrical signal; and a dielectric wall in contact with the transmission line and with the substrate on either side of the transmission line, at least a first portion of the dielectric wall spanning the width of the substrate, the dielectric wall having a locally narrowed region in contact with the transmission line as measured along a propagation direction of the transmission line.

9. The feedthrough of claim 8, wherein a thickest portion of the dielectric wall, as measured along the propagation direction of the transmission line, is at an edge of the dielectric wall opposite to an edge of the dielectric wall in contact with the substrate.

10. The feedthrough of claim 9, wherein the dielectric wall includes a second portion extending across the transmission line and on the substrate on either side of the transmission line, the second portion having a substantially uniform, rectangular cross section viewed in a direction perpendicular to the direction of propagation of the transmission line, the second portion having a thickness measured along the direction of propagation of the transmission line, the thickness being smaller than a portion of greatest thickness of the portion.

11. The feedthrough of claim 10, wherein the dielectric wall contains an air cavity disposed substantially above the transmission line.

* * * * *